US010312310B2

(12) United States Patent
Dykaar

(10) Patent No.: US 10,312,310 B2
(45) Date of Patent: Jun. 4, 2019

(54) OLED DISPLAY AND METHOD OF FABRICATION THEREOF

(71) Applicant: DIFTEK LASERS, INC., Waterloo (CA)

(72) Inventor: Douglas R. Dykaar, Waterloo (CA)

(73) Assignee: DIFTEK LASERS, INC., Waterloo, Ontario (CA)

( * ) Notice: Subject to any disclaimer, the term of this patent is extended or adjusted under 35 U.S.C. 154(b) by 0 days.

(21) Appl. No.: 15/398,302

(22) Filed: Jan. 4, 2017

(65) Prior Publication Data

US 2017/0207284 A1 Jul. 20, 2017

Related U.S. Application Data

(60) Provisional application No. 62/280,555, filed on Jan. 19, 2016.

(51) Int. Cl.
*H01L 21/00* (2006.01)
*H01L 27/32* (2006.01)
(Continued)

(52) U.S. Cl.
CPC ...... *H01L 27/3253* (2013.01); *H01L 27/3251* (2013.01); *H01L 27/3293* (2013.01);
(Continued)

(58) Field of Classification Search
CPC . H01L 27/3253; H01L 51/56; H01L 51/0024; H01L 51/003; H01L 51/0237;
(Continued)

(56) References Cited

U.S. PATENT DOCUMENTS 3,025,335 A 2/1960 Ralph
3,649,354 A 3/1972 Te Velde
(Continued)

FOREIGN PATENT DOCUMENTS

CN 1373906 A 10/2002
CN 103858221 A 6/2014
(Continued)

OTHER PUBLICATIONS

Extended European Search Report (EESR) dated Oct. 13, 2017, by EPO, re European Patent Application No. 17001028.4.
(Continued)

*Primary Examiner* — Thinh T Nguyen
(74) *Attorney, Agent, or Firm* — Perry + Currier, Inc.

(57) ABSTRACT

According to the present specification there is provided an active matrix OLED display and a method of fabrication thereof, the method comprising: providing a backplane and an OLED assembly and then joining the two together. The backplane comprises a plurality of controllable gated electronic components each at a predetermined position on or directly beneath a surface of the backplane substrate. The controllable gated electronic components are configured to control one or more pixels of the active matrix OLED display. The OLED assembly comprises one or more pixel regions each having one or more pixel contacts. In addition, the OLED assembly is formed separately from the backplane on an OLED substrate different from the backplane substrate. The joining comprises electrically connecting one or more of the pixel contacts to the corresponding controllable gated electronic components.

21 Claims, 8 Drawing Sheets

(51) Int. Cl.
*H01L 51/00* (2006.01)
*H01L 51/52* (2006.01)
*H01L 51/56* (2006.01)

(52) U.S. Cl.
CPC ...... *H01L 51/0024* (2013.01); *H01L 51/5237* (2013.01); *H01L 51/5246* (2013.01); *H01L 51/5268* (2013.01); *H01L 51/5271* (2013.01); *H01L 51/5284* (2013.01); *H01L 51/56* (2013.01); *H01L 51/003* (2013.01); *H01L 51/0097* (2013.01); *H01L 2227/323* (2013.01); *H01L 2227/326* (2013.01); *H01L 2251/5338* (2013.01)

(58) Field of Classification Search
CPC ............. H01L 51/5268; H01L 51/5284; H01L 27/3293; H01L 51/0097; H01L 2227/323
USPC ............. 438/84, 102, 128, 118, 406, 82, 99; 257/40, 59, 72, 79
See application file for complete search history.

(56) References Cited

U.S. PATENT DOCUMENTS

| | | | |
|---|---|---|---|
| 3,998,659 | A | 12/1976 | Wakefield |
| 4,136,436 | A | 1/1979 | Kilby et al. |
| 4,270,263 | A | 6/1981 | Johnson et al. |
| 4,430,150 | A | 2/1984 | Levine et al. |
| 4,470,874 | A | 9/1984 | Bartush et al. |
| 4,479,847 | A | 10/1984 | McCaldin et al. |
| 4,614,835 | A | 9/1986 | Carson et al. |
| 4,637,855 | A | 1/1987 | Witter et al. |
| 4,872,607 | A | 10/1989 | Jensen et al. |
| 5,069,740 | A | 12/1991 | Levine et al. |
| 5,086,003 | A | 2/1992 | Hammerbacher |
| 5,091,319 | A | 2/1992 | Hotchkiss et al. |
| 5,377,031 | A | 12/1994 | Vu et al. |
| 5,431,127 | A | 7/1995 | Stevens et al. |
| 5,469,020 | A | 11/1995 | Herrick |
| 5,945,725 | A | 8/1999 | Ishikawa |
| 5,955,776 | A | 9/1999 | Ishikawa |
| 6,204,545 | B1 | 3/2001 | Nakata |
| 6,316,278 | B1 | 11/2001 | Jacobsen et al. |
| 6,440,785 | B1 | 8/2002 | Yamazaki et al. |
| 6,464,890 | B2 | 10/2002 | Knappenberger et al. |
| 6,528,379 | B2 | 3/2003 | Takada et al. |
| 6,679,998 | B2 | 1/2004 | Knappenberger et al. |
| 6,744,073 | B1 | 6/2004 | Nakata |
| 6,844,673 | B1* | 1/2005 | Bernkopf ............ H01L 27/3253 313/498 |
| 7,078,275 | B2 | 7/2006 | Hiroshima et al. |
| 7,091,073 | B2 | 8/2006 | Inoue |
| 7,205,626 | B1 | 4/2007 | Nakata |
| 7,737,006 | B2 | 6/2010 | Colfer et al. |
| 7,811,839 | B2 | 10/2010 | Kasahara et al. |
| 8,088,676 | B2 | 1/2012 | Wong et al. |
| 8,188,474 | B2* | 5/2012 | Hatano ............... H01L 27/1214 257/222 |
| 8,575,471 | B2 | 11/2013 | Norman et al. |
| 8,846,505 | B2 | 9/2014 | Einav |
| 8,999,742 | B1 | 4/2015 | Lowenthal et al. |
| 9,067,792 | B1 | 6/2015 | Hariharan et al. |
| 9,209,019 | B2 | 12/2015 | Dykaar |
| 9,224,851 | B2 | 12/2015 | Dykaar |
| 2002/0011665 | A1 | 1/2002 | Tatsumi et al. |
| 2002/0050061 | A1 | 5/2002 | Komyoji et al. |
| 2002/0074655 | A1 | 6/2002 | Uchiyama |
| 2002/0153529 | A1 | 10/2002 | Shie |
| 2003/0201716 | A1* | 10/2003 | Yamazaki ............ H01L 27/322 313/506 |
| 2003/0234398 | A1 | 12/2003 | Aoki et al. |
| 2004/0016456 | A1 | 1/2004 | Murozono et al. |
| 2004/0248429 | A1 | 12/2004 | Aoki |
| 2005/0127379 | A1 | 6/2005 | Nakata |
| 2006/0040435 | A1 | 2/2006 | Morisue et al. |
| 2006/0148166 | A1 | 7/2006 | Craig et al. |
| 2006/0185716 | A1 | 8/2006 | Murozono et al. |
| 2007/0069642 | A1 | 3/2007 | Kitai et al. |
| 2007/0173000 | A1 | 7/2007 | Yamayaki |
| 2008/0121987 | A1 | 5/2008 | Chen |
| 2008/0153214 | A1 | 6/2008 | Jung et al. |
| 2010/0019665 | A1* | 1/2010 | Kwon ................ H01L 27/3253 313/504 |
| 2010/0052511 | A1 | 3/2010 | Keesmann |
| 2010/0167441 | A1 | 7/2010 | Ray et al. |
| 2010/0216076 | A1 | 8/2010 | Hong et al. |
| 2011/0186862 | A1 | 8/2011 | Harada et al. |
| 2011/0272706 | A1 | 11/2011 | Kwak et al. |
| 2012/0067273 | A1 | 3/2012 | Sachs et al. |
| 2014/0170690 | A1 | 6/2014 | Ziegler et al. |
| 2015/0170575 | A1 | 6/2015 | Kwak et al. |

FOREIGN PATENT DOCUMENTS

| | | |
|---|---|---|
| DE | 112006000411 T5 | 2/2008 |
| EP | 0663689 A1 | 7/1995 |
| EP | 1102332 A2 | 5/2001 |
| EP | 1693903 A1 | 8/2006 |
| EP | 2099064 A1 | 9/2009 |
| EP | 2833391 A1 | 2/2015 |
| EP | 2846354 A2 | 3/2015 |
| JP | 1986171165 | 8/1986 |
| JP | 1986171165 | 10/1986 |
| JP | 1989276750 | 11/1989 |
| JP | 2001-230432 A | 8/2001 |
| JP | 2001230439 A | 8/2001 |
| JP | 2002111021 A | 4/2002 |
| JP | 2004-056014 A | 2/2004 |
| JP | 200589239 A | 4/2005 |
| JP | 2011181534 A | 9/2011 |
| JP | 2014203675 A | 10/2014 |
| KP | 20070032488 A | 3/2007 |
| KR | 20080104947 A | 12/2008 |
| WO | WO-9828947 A1 | 7/1998 |
| WO | WO-2005024951 A1 | 3/2005 |
| WO | WO-2005041286 A1 | 5/2005 |
| WO | WO-2008057483 A2 | 5/2008 |
| WO | WO-2012102343 A1 | 8/2012 |
| WO | WO-2013053052 A1 | 4/2013 |

OTHER PUBLICATIONS

English family patent version of CN1373906A. US Patent Issued on Apr. 17, 2007.
Notice of Reasons for Rejection dated Aug. 2, 2016 for Japanese Patent Application No. 2015-107915.
Extended European Search Report dated Sep. 13, 2017, by EPO, re European Patent Application No. 17151980.
Dykaar, Douglas R., et al. "Active Backplane Design for Digital Video Walls", DifTek Lasers, Inc., Waterloo, Canada, Department of Electrical & Computer Engineering, University of Waterloo, Waterloo, Canada, and Christie Digital Systems Canada Inc., Kitchener, Canada, May 2017.
Yu, Gang, et al. "35.4 L: Late-News Paper: Metal-Oxide Thin Film Transistor with High Performance and Good Operation Stability." SID Symposium Digest of Technical Papers. vol. 42. No. 1. Blackwell Publishing Ltd, 2011.
Related U.S. Appl. No. 13/992,063, "Office Action" dated Feb. 9, 2015.
Vakurov et al., "Electrochemical Modeling of the Silica Nanoparticle-Biomembrane Interaction", Langmuir 2012, 28, pp. 1246-1255.
Extended European Search Report—European Patent Application No. 12839944.1 dated Sep. 15, 2015.
Liu, Zhao Jun, et al. "360 PPI Flip-Chip Mounted Active Matrix Addressable Light Emitting Diode on Silicon (LEDoS) Micro-Displays", IEEE, Journal of Display Technology, vol. 9, No. 8, Aug. 2013, pp. 678-682.
LRTB R48G, Multi Chipled Data Sheet, Version 1.2, OSRAM Opto Semiconductors GmbH, Aug. 25, 2014, pp. 1-29.

(56) References Cited

OTHER PUBLICATIONS

Office Action (with English translation) dated Oct. 24, 2017, by JPO, re Japanese Patent Application No. 2014-173705.
Communication pursuant to Rules 70(2) and 70a(2) EPC dated Oct. 2, 2015 for European Patent Application No. 12839944.1.
Nojiri, Takeshi "Doping Paste for Photovoltaic Solar Cell", Hitachi Chemical Technical Report No. 56 (Dec. 2013) (with Original Chinese document).
Gao, Yu et al., "Doping Silicon Wafers with Boron by Use of Silicon Paste", J. Mater. Sci. Technol., 2013, 29(7), 652-654.
Lim, Taewoong et al., "Experimental Study on Spreading and Evaporation of Inkjet Printed Pico-Liter Droplet on a Heated Substrate", International Journal of Heat and Mass Transfer 52 (2009) 431-441.
"Honeywell Printable Dopants for Advanced c-Si Cells", Honeywell Electronic Materials, 2011, https://honeywell.com/sites/jp/Products-Services/Chemicals-Specialty-Materials-Fertilizers/documents/Printable_dopants_for_advanced_c-Si__cells.pdf.
Meena, Jagan Singh et al., "Polystyrene-block-poly(methylmethacrylate) composite material film as a gate dielectric for plastic thin-film transistor applications", The Royal Society of Chemistry 2014, RSC Adv., 2014, 4, 18493-18502.
Sirringhaus, H. et al., "High-Resolution Inkjet Printing of All-Polymer Transistor Circuits", www.sciencemag.org, Science, vol. 290, Dec. 15, 2000.
Stuwe, D. et al., "InkJet-Printed Diffusion Sources", Presented at the 29th European PV Solar Energy Conference and Exhibition, Sep. 22-26, 2014, Amsterdam (NL).
Daniel, Jurgen, "Printed Electronics: Technologies, Challenges and Applications", Palo Alto Research Center, International Workshop on Flexible and Printed Electronics (IWFPE 10), Sep. 8-10, Muju Resort, Korea.
Non-Final Rejection dated Mar. 3, 2017, but the USPTO, re U.S. Appl. No. 15/235,472.
Notice of Allowance dated May 25, 2016 for U.S. Appl. No. 14/879,884.
Machine Translation (English) of Japanese Patent Publication No. JP2011181534, dated Jan. 29, 2013, by Lexis Nexis.
Ishihara, Ryoichi, et al., "Solution Processed Single-Grain Si TFTs on a Plastic Substrate", SID Symposium Digest of Technical Papers, vol. 45, Issue 1, pp. 439-442, Jun. 2014 (Article first published online: Jul. 7, 2014).
Machine Translation (English) of German Patent Application No. DE112006000411 (T5), dated Jan. 29, 2013, by Lexis Nexis.
Extended European Search Report dated Apr. 4, 2017 for European Patent Application No. 14182511.7.
Imanaka, Yoshihiko, "Multilayered Low Temperature Cofired Ceramics (LTCC) Technology", Chapter 7 title: Printing and Laminating, pp. 145-166, (2005) Springer US.
Li, Jian-Guo, "Wetting of Ceramic Materials by Liquid Silicon, Aluminium and Metallic Melts Containing Titanium and Other Reactive Elements: A Review", Ceramics International 20 (1994) 391-412, 1994.
Kugimiya, K., et al., "101-Stage 2 µm Gate Ring Oscillators in Laser-Grown Silicon Islands Embedded in SiO2", IEEE Electron Device Letters, p. 270-272, vol. EDL-3, No. 9, Sep. 1982.
Scharff, W., et al., "Growth of Monocrystalline Silicon Islands on Insulating Substrates", Thin Solid Films, 113(1984) 327-335.
Chen, Tao, et al., "Location- and Orientation-Controlled (100) and (110) Single-Grain Si TFTs Without Seed Substrate", IEEE Transactions on Electron Devices, p. 2348-2352, vol. 57, No. 9, Sep. 2010.
Henke, Thomas, et al., "Formation of Regularly Arranged Large Grain Silicon Islands by Using Embedded Micro Mirrors in the Flash Crystallization of Amorphous Silicon", Journal of Applied Physics 115, 034301 (2014); view online: http://dx.doi.org/10.1063/1.4861398, published by AIP Publishing.
Matsuki, Nobuyuki, et al., "Investigation of Local Electrical Properties of Coincidence-Site-Lattice Boundaries in Location-Controlled Silicon Islands Using Scanning Capacitance Microscopy", Applied Physics Letters 93, 062102 (2008); view online: http://dx.doi.org/10.1063/1.2968663, Published by AIP Publishing.
Van Der Wilt, Paul Ch., et al. "Formation of Location-Controlled Crystalline Islands Using Substrate-Embedded Seeds in Excimer-Laser Crystallization of Silicon Films", Applied Physics Letters 79, 1819 (2001); view online: http://dx.doi.org/10.1063/1.1402641, published by AIP Publishing.
1st Notice of Reasons for Rejection dated Jan. 12, 2016 with English Translation for Japanese Patent Application No. 2014-534897.
2nd Notice of Reasons for Rejection dated Jul. 12, 2016 with English Translation for Japanese Patent Application No. 2014-534897.
Drevet B et al.: "Wetting, infiltration and sticking phenomena in Si3N4 releasing coatings in the growth of photovoltaic silicon", Solar Energy Materials and Solar Cells, Elsevier Science Publishers, Amsterdam, NL, vol. 94, No. 3, Mar. 2010 (Mar. 2010), pp. 425-431, XP026878452, ISSN: 0927-0248 [retrieved on Nov. 28, 2009]. pp. 425-426, chapter 2, Experimental procedure. pp. 426-430, chapter 3, Results and discussion. Figures 2-6, 9, 12.
Extended European Search Report dated Jan. 15, 2016 for European Patent Application No. 15153173.8.
Itoh Hironori et al.: "In situ observation of melting and crystallization of Si on porous Si3N4substrate that repels Si melt", Journal of Crystal Growth, Elsevier, Amsterdam, NL, vol. 401, Mar. 12, 2014 (Mar. 12, 2014), pp. 359-363, XP029040773, ISSN: 0022-0248, DOI: 10.1016/J.JCRYSGRO.2014.02.044, the whole document.
Liu et al.: "A concentrator module of spherical Si solar cell", Solar Energy Materials and Solar Cells, Elsevier Science Publishers, Amsterdam, NL, vol. 91, No. 19, Sep. 14, 2007 (Sep. 14, 2007), pp. 1805-1810, XP022245075, ISSN: 0927-0248, DOI:10.1016/J.SOLMAT.2007.06.008 figure 3.
Notice of Allowance dated Mar. 16, 2016, by the USPTO, re U.S. Appl. No. 14/610,567.
Zhang, J., et al., "Single-Grain Si Thin-Film Transistors on Flexible Polyimide Substrate Fabricated From Doctor-Blade Coated Liquid-Si", Applied Physics Letters 102, 243502 (2013); view online: http://aip.scitation.org/doi/10.1063/1.4811356.
Extended European Search Report dated Jul. 14, 2015, for related European Patent Application No. 14182511.7.
English Translation of Notice of Reasons for Rejection, dated Jan. 12, 2016, for Related Japanese Patent Application No. 2014-534897.
Office Action dated Mar. 21, 2016, by SIPO, re Chinese Patent Application No. 201280050565.X.
Application Note—"AngstromSphere Dispersion Tehcnique", Published by Fiber Optic Centre, Inc., 2008.
Cbrite Inc., Marketing Document—"Enabling the 'displays of tomorrow', Today!", 2011.
Choi et al. "TFT Backplane Technologies for AMCLD and AMOLED Applications", Journal of the Korean Physical Society, vol. 54, No. 1, Jan. 2009, pp. 549-553.
International Search Report dated Jan. 30, 2013 for related PCT International Patent Application No. PCT/CA2012/000956.
Findikoglu, et al., "Aligned-Crystalline Silicon Films on Non-Single-Crystalline Substrates", Los Alamos National Laboratory publication, MRS, 2006, Report No. LA-UR-6-1165, pp. 1-11.
Gharghi et al. "Growth and structural characterization of spherical silicon crystals grown from polysilicon." Journal of electronic materials 37.11 (2008): 1657-1664.
Gharghi, et al. "Three-dimensional modeling and simulation of pn junction spherical silicon solar cells." Electron Devices, IEEE Transactions on 53.6 (2006): 1355-1363.
Hamer et al. 63.2: AMOLED Displays using Transfer-Printed Integrated Circuits SID Symposium Digest of Technical Papers, vol. 40 Issue 1, pp. 947-950, Jun. 2009.
Kim et al.: A Review of Recent Advances in Backplanes and Color Patterning Technologies for AMOLED Display Photonics Society Newsletters, Apr. 2013.
Kwon, Oh-Kyong. "TFT mobility requirement for AMOLED HDTVs." Thin film transistor technologies (TFTT VII): proceedings of the international symposium. vol. 146. 2004.

(56) References Cited

OTHER PUBLICATIONS

McKee, William R.—Development of the Spherical Silicon Solar Cell; IEEE Transactions on Components, Hybrids and Manufaturing Technology, vol. CHMT-5, No. 4, Dec. 1982.

Omae, Satoshi et al. "Crystal Characterization of Spherical Silicon Solar Cell by X-ray Diffraction" Japanese Journal of Applied Physics, vol. 45, No. 5A, 2006, pp. 3933-3937.

"EPO-TEK H20E Technical Data Sheet", https://www.tedpella.com/technote_html/16014_H20E_TN.pdf, dated Mar. 2014, retrieved Mar. 20, 2017.

"Flip Chip", http://www.creativematerials.com/applications/flip-chip/, accessed Nov. 25, 2015.

Carney, Austin. "Why the iPhone 6s Camera is the Best Ever", Oct. 7, 2015 http://www.tdcurran.com/blog/2015/10/07/why-the-iphone-6s-camera-is-the-best-ever.

Hueners, Bruce, "Flip Chip Attach Alternatives" http://electroiq.com/blog/2005/05/flip-chip-attach-alternatives/, published May 2005.

Patterson, Tim, et al., Flip Chip on Flex Interconnect Guidelines, dated Nov. 1999, Smartlfex Systems, Inc., Tustin, CA, http://www.semicorp.com/articles/published-articles/item/flip-chip-on-flex-interconnect-guidelines.

Rogers et al.: Synthesis, assembly and applications of semiconductor nanomembranes; Nature, vol. 477, Sep. 1, 2001; pp. 45-51.

Sakariya et al.: Vt-Shift Compensating Amorphous Silicon Pixel Circuits for Flexible OLED Displays Materials Research Society Symp. Proc. vol. 736, 2003; pp. D7.15.1 to D7.15.6.

Supplementary Partial European Search Report dated Apr. 30, 2015 for related European Patent Application No. 12839944.1.

Takeda, Nobuo, MEMS applications of Ball Semiconductor Technology, Micro Electra Mechanical Systems, 2000. MEMS 2000. The Thirteenth Annual International Conference. Jan. 23, 2000.

Talhgader, Joseph J. "Integration of LEDs and VCSELs using fluidic self-assembly." Optoelectronics and High-Power Lasers & Applications. International Society for Optics and Photonics, 1998.

Tien, et al. "Microfabrication through electrostatic self-assembly." Langmuir 13.20 (1997): 5349-5355.

Wang, Y. et al. Large-area self assembled monolayers of silica microspheres formed by dip coating. Materials Science-Poland, vol. 28, No. 2, 2010.

Xia, Deying et al. Lithographically directed deposition of silica nanoparticles using spin coating. Center for High Technology Materials and Department of Electrical and Computer Engineering, University of New Mexico, 1313 Goddard SE, Albuquerque, New Mexico 87106. (Published Dec. 14, 2004).

Zhao, L., et al. "Novel Method for Fabricating Flexible Active Matrix Organic Light Emitting Diode (AMOLED) Displays." Published by HP Laboratories. Sep. 21, 2011. http://www.hpl.hp.com/techreports/2011/HPL-2011-152.pdf.

Zhirnov, Victor V. et al. New Frontiers: Self-Assembly and Nanoelectronics. Semiconductor Research Corp. Jan. 2001.

Zhu, Ting, et al. "Mechanics of a process to assemble microspheres on a patterned electrode." Applied Physics Letters 88.14 (2006): 144101.

"APN3001: Epoxy Die Attachment for GaAs Flip Chip Devices", Application Note—APN3001, Skyworks Solutions, Inc., Jan. 29, 2008, http://www.skyworksinc.com/uploads/documents/200741A.pdf.

Clayton, James, E., et al., "Assembly Technique for a Fine-Pitch, Low-Noise Interface; Joining a CdZnTe Pixel-Array Detector and Custom VLSI Chip with Au Stud Bumps and Conductive Epoxy", Polymer Assembly Technology, Dept. of Physics, Mail Code 220-47, California Institute of Technology, ? http://www.polymerassemblytech.com/corp/papers/IEEENSSMICPaper.pdf, accessed Nov. 25, 2015.

Findikoglu, Alp T., et al., "Well-Oriented Silicon Thin Films with High Carrier Mobility on Polycrystalline Substrates", Advance Matters 2005, vol. 17, pp. 1527-1531.

Official Communication dated Aug. 26, 2015 for European Patent Application No. 15153173.8.

Partial European Search Report, dated Jun. 9, 2017, by EPO, re European Patent Application No. 17151980.4. 15 pages.

SIPO, Second Office Action, dated Nov. 12, 2018, re Chinese Patent Application No. 201410452718.4.

EPO, Communication pursuant to Article 94(3) EPC. dated Oct. 29, 2018, re European Patent Application No. 12839944.1.

SIPO, First Examination Report, dated Sep. 10, 2018, re Chinese Patent Application No. 201610885147.2.

Alam, Mohammed R., Non-Final Rejection issued in corresponding U.S. Appl. No. 15/827,446, filed Nov. 30, 2017, entitled: Electronic Device and Method of Making Thereof.

USPTO, Non-Final Rejection, Jan. 31, 2019, re U.S. Appl. No. 15/827,446.

* cited by examiner

OLED DISPLAY AND METHOD OF FABRICATION THEREOF

CROSS-REFERENCE TO RELATED APPLICATION

This application claims priority from U.S. Provisional Patent Application No. 62/280,555, filed on Jan. 19, 2016, which is incorporated herein by reference in its entirety.

FIELD

The present specification relates to OLED displays, and in particular to active matrix OLED displays and methods of fabrication thereof.

BACKGROUND

Single-crystal silicon is used for most electronic applications. Exceptions exist, such as displays and some imagers, where amorphous silicon is applied to glass substrates in order to operate the display or imager pixel. In many applications, the display or imager is fabricated on top of the silicon electronics. For application to liquid crystal displays (LCDs), amorphous silicon has provided sufficient performance. For next generation display devices such as Organic Light Emitting Diodes (OLED), active matrix drive transistors made from amorphous silicon have proven problematic. Fundamentally, LCDs use voltage devices, and active matrix OLEDs require current devices. Attempts to extend the conventional approach involve modifying the prior-art amorphous-silicon on glass. Amorphous-silicon is applied to the entire substrate panel, typically greater than two meters on a side, and then is re-crystallized using large excimer lasers and scanning a line focus across the panel. The laser has to be pulsed so as to only melt the Si surface and not the glass. This technique results in the formation of poly-crystal silicon rather than single-crystal silicon.

The mobility of any type of amorphous or poly-crystalline transistor, including non-silicon and organic devices, is much smaller than the mobility of single-crystal silicon transistors. Electron mobility in amorphous silicon is ~1 $cm^2/V \cdot s$ compared to ~100 $cm^2/V \cdot s$ for poly-silicon, and ~1500 $cm^2/V \cdot s$ for high-quality single-crystal silicon. It is therefore advantageous to use single-crystal silicon in place of amorphous silicon in such devices. However, silicon wafers are typically 300 mm in diameter, compared to current display panels which can measure at more than 2 meters on a side. In the case of such large area devices, including large area OLED displays, larger wafers of single crystal silicon can become prohibitively expensive and/or technically impractical to fabricate.

In addition, in making conventional active matrix OLED displays the light emitting material is typically deposited as a thin film on an active matrix backplane. This process has at least two significant limitations: first, even a small degree of roughness on the surface of the backplane can interfere with the deposition of the light emitting layers and cause malfunction in the final display. Second, since the light emitting layers and the backplane are rigidly attached to one another, there must be a close match between their respective coefficients of thermal expansion (CTE) to avoid damage to the display as a result of temperature changes. This need for a close CTE match limits the types of materials that can be used for the backplane and for the light emitting layers.

SUMMARY

In this specification, elements may be described as "configured to" perform one or more functions or "configured for" such functions. In general, an element that is configured to perform or configured for performing a function is enabled to perform the function, or is suitable for performing the function, or is adapted to perform the function, or is operable to perform the function, or is otherwise capable of performing the function.

It is understood that for the purpose of this specification, language of "at least one of X, Y, and Z" and "one or more of X, Y and Z" can be construed as X only, Y only, Z only, or any combination of two or more items X, Y, and Z (e.g., XYZ, XY, YZ, ZZ, and the like). Similar logic can be applied for two or more items in any occurrence of "at least one . . . " and "one or more . . . " language.

An aspect of the present specification provides a method of forming an active matrix OLED display, the method comprising providing a backplane. The backplane comprises a backplane substrate comprising a support material and one or more component substrates formed separately from the support material and then secured to the support material each at a predetermined position on the support material. The backplane also comprises a plurality of controllable gated electronic components formed on or directly beneath a surface of the corresponding component substrates. The controllable gated electronic components are configured to control one or more pixels of the active matrix OLED display. The method further comprises providing an OLED assembly comprising one or more pixel regions each having one or more pixel contacts. The OLED assembly is formed separately from the backplane on an OLED substrate different from the backplane substrate. The method also comprises joining the OLED assembly to the backplane, the joining comprising electrically connecting one or more of the pixel contacts to the corresponding controllable gated electronic components.

Each pixel region can comprise a light emissive area and at least one of the pixel contacts corresponding to each pixel region can be contained within the corresponding light emissive area.

The electrically connecting can comprise using a flexible conductive link to connect the one or more of the pixel contacts to the corresponding controllable gated electronic components.

The flexible conductive link can comprise one or more of a conductive epoxy, a solder, and a low temperature solder.

The method can further comprise underfilling with a substantially black underfill at least a portion of gaps between the OLED assembly and the backplane joined together.

The backplane substrate can comprise a plurality of through holes configured for allowing injecting an underfill through the through holes into at least a portion of gaps between the OLED assembly and the backplane joined together.

One or both of the backplane and the OLED assembly can be flexible and can be configured to be unrolled one against the other one or more of before and during the backplane being joined to the OLED assembly.

The method can further comprise depositing an underfill on at least a portion of one or both of the backplane and the OLED assembly before one is unrolled against the other in order to fill with the underfill at least a portion of gaps between the OLED assembly and the backplane joined together.

The OLED assembly can further comprise an optical barrier between each pixel region and its adjacent pixel regions, the optical barrier configured to at least partially block a light emitted at each pixel region from entering adjacent pixel regions through the OLED assembly.

The optical barrier can comprise grooves in a first surface of the OLED substrate, the grooves configured to at least partially block the light emitted at each pixel region from entering the adjacent pixel regions through the OLED assembly.

The optical barrier can further comprise further grooves in a second surface of the OLED substrate, the second surface opposite the first surface, the further grooves aligned with the grooves.

The grooves can extend through a full thickness of the OLED substrate thereby separating a portion of the OLED substrate corresponding to each pixel region from portions of the OLED substrate corresponding to adjacent pixel regions.

The OLED assembly can be joined to the backplane and then at least a portion of gaps between the OLED assembly and the backplane can be filled by an underfill before the grooves are formed.

The OLED substrate can be secured to a support and then the grooves can be formed before depositing one or more light emitting layers on the OLED substrate to form the OLED assembly and the joining the OLED assembly to the backplane.

The support can be removed from the OLED substrate after the joining the OLED assembly to the backplane.

The OLED substrate can be secured to the support using an adhesive and the removing can comprise using a UV laser to ablate the adhesive.

The grooves can be formed by one or more of: wet chemical etching, laser etching, scribing, sawing using a dicing saw, and deep reactive ion etching.

The grooves can be configured to be one or more of: totally internally reflecting and metalized, in order to at least partially reflect the light emitted at that pixel region away from the adjacent pixel regions.

The grooves can be configured to be one or more of: light scattering and light absorbing, in order respectively to at least partially scatter and partially absorb the light emitted at each pixel region and propagating towards adjacent pixel regions through the OLED assembly.

The grooves can be at least partially filled with one or more of: a light scattering material and a light absorbing material, in order respectively to at least partially scatter and partially absorb the light emitted at each pixel region and propagating towards adjacent pixel regions through the OLED assembly.

A further aspect of the present specification provides a method of forming an active matrix OLED display, the method comprising providing a backplane. The backplane comprises a backplane substrate and a plurality of controllable gated electronic components each at a predetermined position on or directly beneath a surface of the backplane substrate. The controllable gated electronic components are configured to control one or more pixels of the active matrix OLED display. The method further comprises providing an OLED assembly comprising one or more pixel regions each having one or more pixel contacts. The OLED assembly is formed separately from the backplane on an OLED substrate different from the backplane substrate. The method also comprises joining the OLED assembly to the backplane, the joining comprising using flexible conductive links to electrically connect one or more of the pixel contacts to the corresponding controllable gated electronic components.

A further aspect of the present specification provides an active matrix OLED display comprising a backplane. The backplane comprises a backplane substrate comprising a support material and one or more component substrates formed separately from the support material and then secured to the support material each at a predetermined position on the support material. The backplane also comprises a plurality of controllable gated electronic components formed on or directly beneath a surface of the corresponding component substrates. The controllable gated electronic components are configured to control one or more pixels of the active matrix OLED display. The active matrix OLED display also comprises an OLED assembly comprising one or more pixel regions each having one or more pixel contacts. The OLED assembly is formed separately from the backplane on an OLED substrate different from the backplane substrate. The active matrix OLED display also comprises a plurality of flexible conductive links electrically connecting at least some of the pixel contacts to the corresponding controllable gated electronic components.

The OLED assembly can further comprise an optical barrier between each pixel region and its adjacent pixel regions. The optical barrier can be configured to at least partially block a light emitted at each pixel region from entering adjacent pixel regions through the OLED assembly.

The active matrix OLED display can further comprise: one or more additional OLED assemblies connected to the backplane adjacent the OLED assembly, and one or more additional optical barriers disposed between the OLED assembly and the one or more additional OLED assemblies.

A further aspect of the present specification provides a tiled active matrix OLED display comprising a plurality of the active matrix OLED displays positioned one adjacent to another, and one or more additional optical barriers disposed between the adjacent active matrix OLED displays.

BRIEF DESCRIPTION OF THE DRAWINGS

Some implementations of the present specification will now be described, by way of example only, with reference to the attached Figures, wherein.

DETAILED DESCRIPTION

Figure 1:
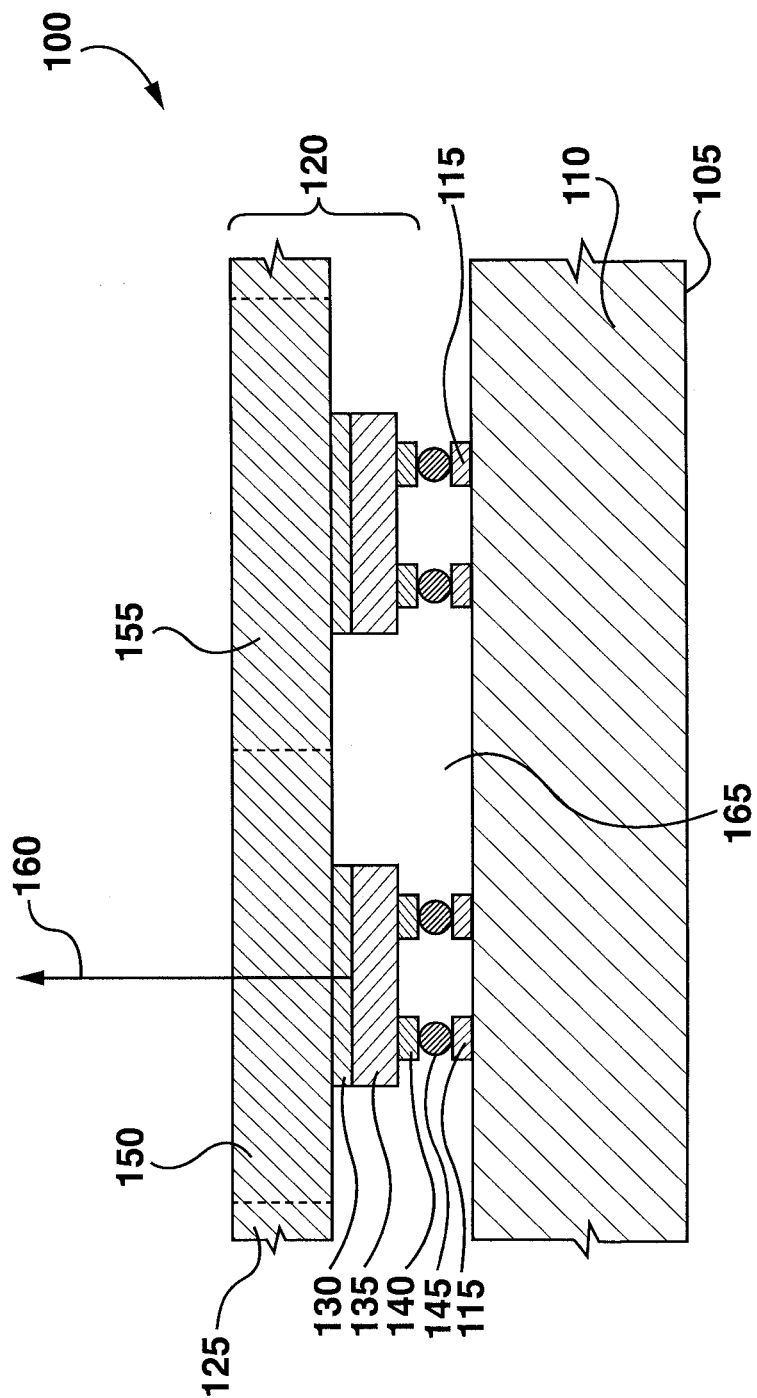
FIG. 1 shows a cross-section of an active matrix OLED display, according to no-limiting implementations.

FIG. 1 shows a cross-section of an active matrix OLED display 100 comprising a backplane 105 electrically connected to an OLED assembly 120. Backplane 105 comprises a backplane substrate 110 and a plurality of controllable gated electronic components 115 each at a predetermined position on or directly beneath a surface of backplane substrate 110. OLED assembly 120 comprises an OLED substrate 125, and a first electrode 130 formed on OLED substrate 125 for each pixel region 150,155. Light emitting materials 135 are formed on first electrode 130, and pixel contacts 140 are formed on light emitting materials 135. OLED assembly 120 can have one or more pixel regions 150,155. Pixel contacts 140 can be electrically connected to corresponding controllable gated electronic components 115 using conductive links 145. Controllable gated electronic components 115 can power and/or control pixel regions 150,155 to emit light in a direction of light emission 160. The light emitted can comprise, but is not limited to, human visible light.

OLED assembly 120 can be formed separately from backplane 105 before being joined to backplane 105. OLED assembly 120 can be formed by depositing sequentially first electrode 130, light emitting materials 135, and then pixel contacts 140 on OLED substrate 125, which OLED substrate 125 can be different from backplane substrate 110. OLED substrate 125 can comprise materials including but not limited to glass and plastics such as polyimide and the like. First electrode 130 comprises a conductive material that is at least partially transparent to light emitted by light emitting materials 135. For example, first electrode 130 can comprise indium tin oxide (ITO).

Light emitting materials 135 can comprise one or more layers of organic light emitting materials. Pixel contacts 140 can comprise layers of conductive material, such as aluminum, formed on light emitting materials 135. FIG. 1 shows OLED assembly 120 divided into pixel regions 150,155. The dashed lines between pixel regions 150 and 155 are for illustrative purposes only and do not represent any physical feature in OLED assembly 120. While FIG. 1 shows each pixel region as having a separate first electrode 130 and light emitting materials 135, it is contemplated that one or more of first electrode 130 and light emitting materials 135 can span multiple pixel regions.

In addition, while FIG. 1 shows each pixel region 150,155 having two visible pixel contacts 140, it is contemplated that each pixel region can have one or more than two pixel contacts. Each pixel region 150,155 can have three pixel contacts 140, each corresponding to one of the primary colors of light, such as red, green, and blue. In some implementations each pixel region can have multiple sub-pixel regions each configured to emit a primary color of light and each having a dedicated pixel contact. In some implementations, two or more pixel regions 150,155 can share a common first electrode 130 which can be used as a counter electrode to pixel contacts 140 and/or as a ground electrode. In other implementations, each pixel region 150,155 can have its own dedicated ground electrode or counter-electrode.

Figure 2:
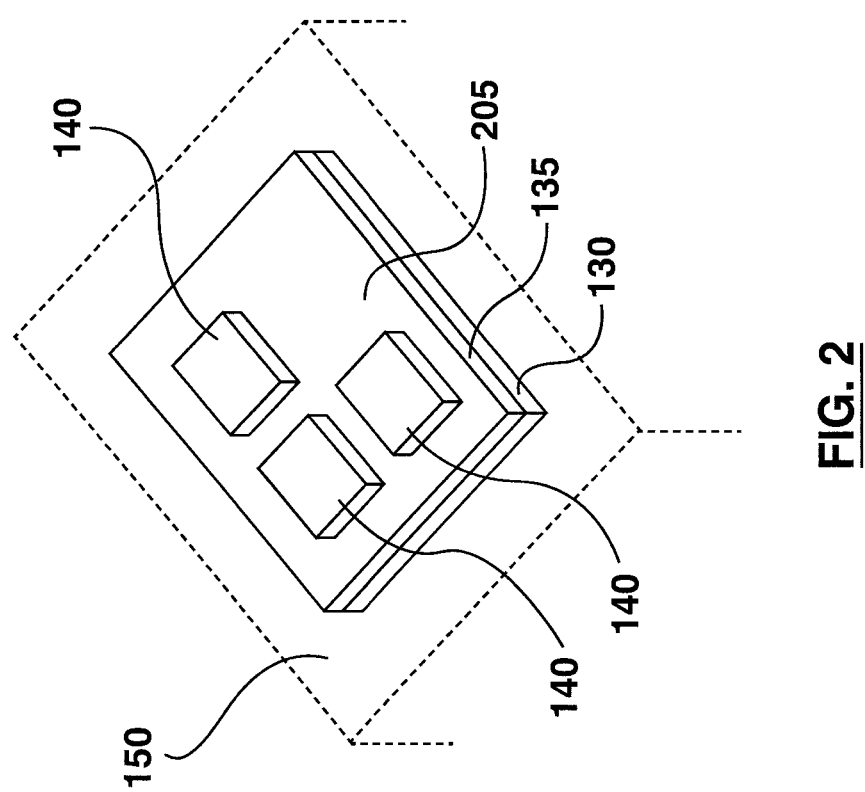
FIG. 2 shows a top perspective view of a pixel region of the active matrix OLED display of FIG. 1, according to non-limiting implementations.

Each pixel region 150,155 has a light emissive area and can also have non-light emissive areas. Now reference is made briefly to FIG. 2, which shows a top perspective view of pixel region 150, which has a light emissive area 205. Light emissive area 205 is the area of pixel region 150 that is covered with light emitting materials 135. For each pixel region, such as pixel regions 150,155, some or all light emissive area 205 can emit light during the operation of that pixel region. In some implementations, pixel contacts 140 can have a larger area relative to light emissive area 205 than the areas/sizes shown in FIGS. 1 and 2. Such relatively larger pixel contacts 140 can power and/or excite a correspondingly larger portion of light emissive area 205 to emit light during the operation of the corresponding pixel region.

Moreover, in some implementations, pixel contacts 140 which are formed on light emitting materials 135 can be contained within light emissive area 205. Since no part of these contacts extends beyond light emissive area 205, in these implementations it may not be necessary to have any non-emissive areas of the pixel region 150 dedicated to the pixel contacts. This arrangement can provide the benefit of allowing for an increased proportion of light emissive area 205 per pixel region 150.

In addition, in some implementations, not shown in the Figures, one or more of pixel contacts 140 can each comprise an extension which extends beyond emissive area 205 and onto OLED substrate 125. Such extensions are insulated from first electrode 130 to prevent electrical shorts between pixel contacts 140 and first electrode 130. In some implementations, the area of OLED substrate 125 that is covered by these extensions is not covered by, i.e. is free of, first electrode 130. These extensions can then be used to electrically connect each pixel region 150,155 to corresponding controllable gated electronic components 115 via conductive links 145.

Using such extensions to move the electrical contacts off of emissive area 205 can provide one or more of the following benefits: first, it can reduce the risk of conductive link 145 itself and/or the process of applying conductive link 145 damaging light emitting material 135; and second, it can reduce the risk of punch-through shorts between pixel contacts 140 and first electrode 130.

In some implementations, not shown in the Figures, first electrode 130 can extend outside of light emissive area 205, which extension occupies an area of OLED substrate 125 per pixel region that is non-emissive. Such non-emissive areas reduce the fraction of emissive area per pixel region. In contrast, implementations where multiple pixel regions 150,155 share a common first electrode 130 can allow for a larger fraction of light emissive area 205 per pixel, as it may not be necessary to have non-emissive areas of OLED substrate 125 occupied by first electrode 130 in each pixel region.

However, these implementations with shared first electrodes 130 can represent slower electrical performance and/or relatively more electrical parasitics as one first electrode 130 is used for multiple pixel regions. On the other hand, in other implementations where each pixel region 150,155 has a dedicated first electrode 130, the electrical performance can be relatively faster and with fewer electrical parasitics as each first electrode 130 is used for only one pixel region.

Referring back to FIG. 1, in some implementations, backplane substrate 110 can comprise a support material and one or more component substrates formed separately from the support material and then secured to the support material at predetermined positions on the support material. A plurality of controllable gated electronic components can be formed on or directly beneath a surface of the corresponding component substrates. The controllable gated electronic components (or any other electronic/circuit elements formed) can be formed using any suitable techniques including, but not limited to, lithography, printing, and the like.

For example, and without limitation, component substrates can comprise semiconductor particles that are formed separately from the support material and are then secured to the support material. The semiconductor particles can then be planarized to expose cross-sections on or directly beneath the surface of which cross-sections electronic and/or circuit components can be formed using lithography, printing, and the like. Such electronic/circuit components can include, but are not limited to, controllable gated electronic components 115, such as transistors.

Non-limiting examples of such a backplane substrate 110 comprising semiconductor particles secured to a support material are described in US Patent Application Publications No. 2014/0070223 (corresponding to U.S. patent application Ser. No. 13/992,063) and 2015/0064883 (corresponding to U.S. patent application Ser. No. 14/019,131), both of which are incorporated herein by reference in their entirety.

It is contemplated that the component substrates can comprise semiconductors, glass, ceramics, dielectrics, or any other materials suitable for the type of electronic and/or circuit components that is to be formed on and/or in the component substrate. Similarly, the support material can comprise any suitable material including, but not limited to, ceramics, fireable ceramics, glass, plastics, dielectrics, composites, and the like.

In other implementations, controllable gated electronic components 115 can be formed on or directly beneath a surface of their corresponding component substrates, then packaged, and then placed on and secured to the support material at respective predetermined positions. For example, a pick-and-place apparatus can be used to place pre-fabricated controllable gated electronic components 115 at their respective predetermined positions on the support material. Those placed controllable gated electronic components 115 can then be secured to the support material using any suitable method, including but not limited to using an adhesive. In such an implementation also, the backplane comprises the support material and component substrates formed separately from the support material and then secured to the support material at predetermined positions. The backplane also comprises controllable gated electronic components (or other electronic/circuit components) formed on or directly beneath a surface of the corresponding component substrates.

Forming backplane substrate 110 by placing and/or positioning component substrates on the support material only at positions where the component substrate is needed (for fabricating controllable gated electronic components 115) for connecting to corresponding pixel contacts 140 can allow the use of crystalline, high-performance semiconductor materials as the component substrate for forming the controllable gated electronic components 115 while avoiding the high costs and/or technical challenges of covering the entire surface of the support material with such high-performance materials.

In other implementations, backplane 105 can comprise backplane substrate 110 and a plurality of circuit/electronic components, such as controllable gated electronic components 115, formed on or directly beneath the surface of backplane substrate 110. In such implementations, backplane substrate 110 need not comprise any component substrates formed separately from the (support) material of the backplane substrate 110. In other words, the material of backplane substrate 110 can itself act as the component substrate for any electronic/circuit components formed on and/or directly beneath the surface of backplane substrate 110.

Turning now to conductive links 145, while the Figures show conductive links 145 connecting pixel contacts 140 to controllable gated electronic components 115, it is also contemplated that each controllable gated electronic component 115 can comprise one or more contact pads and that conductive links 145 can connect pixel contacts 140 to the corresponding contact pads of controllable gated electronic components 115.

While the description here refers to controllable gated electronic components, it is contemplated that other circuit and/or electronic elements can also be used instead of and/or in addition to controllable gated electronic components. In some implementations, controllable gated electronic components comprise transistors. Controllable gated electronic components 115 can be positioned on backplane substrate 110 so that they are aligned with and/or able to be connected to corresponding pixel contacts 140 of pixel regions 150, 155.

Once backplane 105 and OLED assembly 120 have been formed, then one can be joined to the other. The joining can comprise depositing conductive links 145 on one or more of backplane 105 and OLED assembly 120, and then joining backplane 105 and OLED assembly 120 such that each pixel contact 140 is electrically connected via conductive link 145 to a corresponding controllable gated electronic component 115. Conductive link 145 can comprise materials including but not limited to conductive epoxy such as silver epoxy, a solder, and a low-temperature solder.

In some implementations, spacers can be used to control the distance between OLED assembly 120 and backplane substrate 110, which in turn can control the distance between pixel contacts 140 and corresponding controllable gated electronic components 115 in the assembled active matrix OLED assembly 100. Controlling the distance between pixel contacts 140 and corresponding controllable gated electronic components 115 can, in turn, control the extent to which conductive links 145 spread and/or flow from one pixel contact 140 and its corresponding controllable gated electronic component 115 towards neighboring pixel contacts 140 and/or controllable gated electronic components 115 during the process of joining OLED assembly 120 to backplane substrate 110.

These spacers can comprise shims placed between OLED substrate 125 and backplane substrate 110. In some implementations, these shims can be placed at the edges of OLED substrate 125 and backplane substrate 110 when OLED substrate 125 and backplane substrate 110 are assembled together to form active matrix OLED display 100. Moreover, in some implementations, these shims can be removable after conductive links 145 are no longer in a flowable state.

Once backplane 105 and OLED assembly 120 have been joined together, gaps 165 may remain between backplane 105 and OLED assembly 120. In some implementations, the spacers can comprise spacing particles positioned in gaps 165. These spacing particles can comprise materials including, but not limited to, plastics, glasses, ceramics, and other dielectrics. Moreover, in some implementations the spacing particles can have a shape that is spherical, near spherical, or substantially spherical.

The spacing particles can be positioned on and secured to one or more of backplane substrate 110 and OLED substrate 125. The spacing particles can be positioned and secured to their corresponding substrate using any suitable methods.

For example, and without limitation, predetermined quantities of an adhesive can be printed on or otherwise deposited at predetermined locations on the corresponding substrate. Next, the spacing particles can be introduced on the substrate, and the spacing particles can adhere to the substrate only where the adhesive is present. In some implementations, the relative sizes of the spacing particles and the quantities of adhesive can be such that only one spacing particle can adhere to the substrate for each quantity of adhesive on the substrate. Subsequently, the spacing particles that have not adhered to the substrate can be removed prior to joining backplane substrate 110 and OLED substrate 125 to form active matrix OLED display 100.

In some implementations, instead of and/or in addition to depositing quantities of adhesive at predetermined locations on the substrate, spacing particles can be picked and placed on the substrate at predetermined locations. Moreover, in some implementations spacing particles can be mixed into conductive links 145 when the material of the conductive links 145 is in a flowable state, thereby controlling the minimum distance between pixel contacts 140 and corresponding controllable gated electronic components 115 in the assembled active matrix OLED assembly 100.

Furthermore, in some implementations, gaps 165 can be at least partially filled with an underfill. The underfill can comprise any suitable material, including but not limited to a polymeric material. The underfill can be opaque, light scattering, and/or light absorbing in order to reduce and/or eliminate any visible reflections from the underfill or from backplane substrate 110 that might interfere with the image generated by active matrix OLED display 100.

In some implementations, the underfill can be substantially black. Being substantially black can comprise reflecting a sufficiently small portion of the light incident upon the underfill so that this reflected light would not constitute a human-visible interference with the image generated by active matrix OLED display 100. The underfill can also mechanically strengthen active matrix OLED display 100, for example by strengthening the attachment between backplane 105 and OLED assembly 120. In addition, the underfill can seal and protect the sensitive materials and electronics forming active matrix OLED display 100 from dust, moisture, and other environmental factors.

While in FIG. 1 one controllable gated electronic component 115 is shown as being connected to each pixel contact 140, it is contemplated that two or more controllable gated electronic components 115 can be connected to each pixel contact 140. In some implementations, conductive link 145 can comprise a flexible conductive material such as conductive epoxy. Use of these flexible electrical contacts to join backplane 105 to OLED assembly 120 can allow active matrix OLED display 100 to tolerate different rates of thermal expansion between backplane 105 and OLED assembly 120 without suffering mechanical or electrical damage. This in turn can provide greater freedom in choosing materials of different coefficients of thermal expansion for backplane 105 and OLED substrate 125.

Moreover, using flexible conductive materials can allow conductive links 145 to overlap or be entirely contained on light emissive area 205 of each pixel region 150,155 by reducing the mechanical forces (e.g. shear forces) due to thermal expansion/contraction that can potentially damage sensitive light emitting materials 135. This in turn can reduce the need for dedicating some areas of each pixel region 150,155 to off-emissive-area contacts thereby allowing a greater portion of the area of each pixel region 150,155 to be used as light emissive area 205.

In addition, fabricating backplane 105 and OLED assembly 120 separately and then joining them together to form active matrix OLED display 100 can provide the added benefit that any faults in the manufacturing of each subcomponent (e.g. backplane or OLED assembly) would not affect the other subcomponent if the fault is detected before the two subcomponents are joined together to form active matrix OLED display 100.

Figure 3:
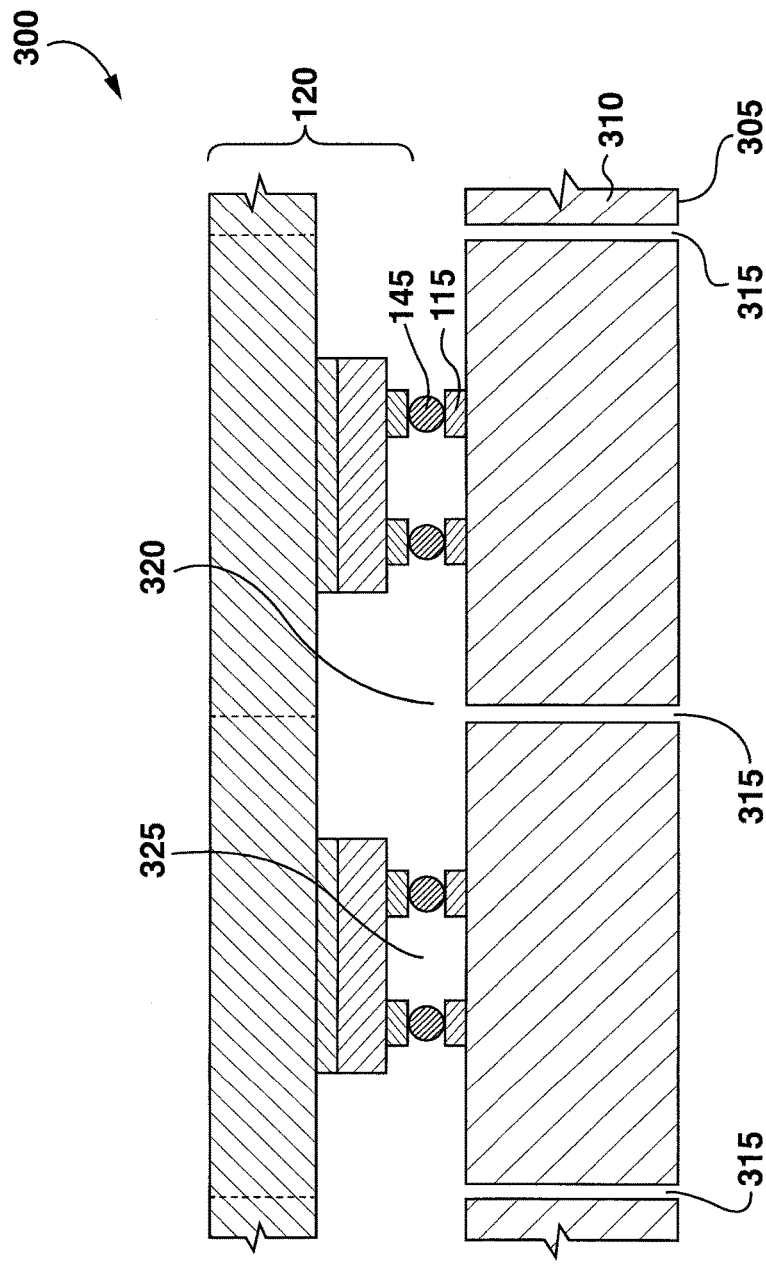
FIG. 3 shows a cross-section of another implementation of the active matrix OLED display, according to non-limiting implementations.

Turning now to FIG. 3, a cross-section of an active matrix OLED display 300 is shown. Active matrix OLED display 300 comprises OLED assembly 120 joined using conductive links 145 to a backplane 305. Backplane 305 comprises a backplane substrate 310 and a plurality of controllable gated electronic components 115 secured to backplane substrate 310 at predetermined positions. When backplane 305 and OLED assembly 120 are joined to form active matrix OLED display 300, gaps 320, 325 can remain between backplane 305 and OLED assembly 120. Backplane 305 can comprise one or more through holes 315 for allowing injecting an underfill from a backside of backplane substrate 310 into gaps 320,325. Backplane 305 can be similar to backplane 105, with the difference being the existence of through holes 315 in backplane 305.

Through holes 315 can be formed using any suitable technique including but not limited to drilling, laser cutting, chemical etching, and reactive ion etching. Using a large number of distributed through holes 315 to inject underfill can allow for a more even distribution of underfill in gaps 320,325 and for filling with underfill a larger fraction of gaps 320,325.

Figure 4:
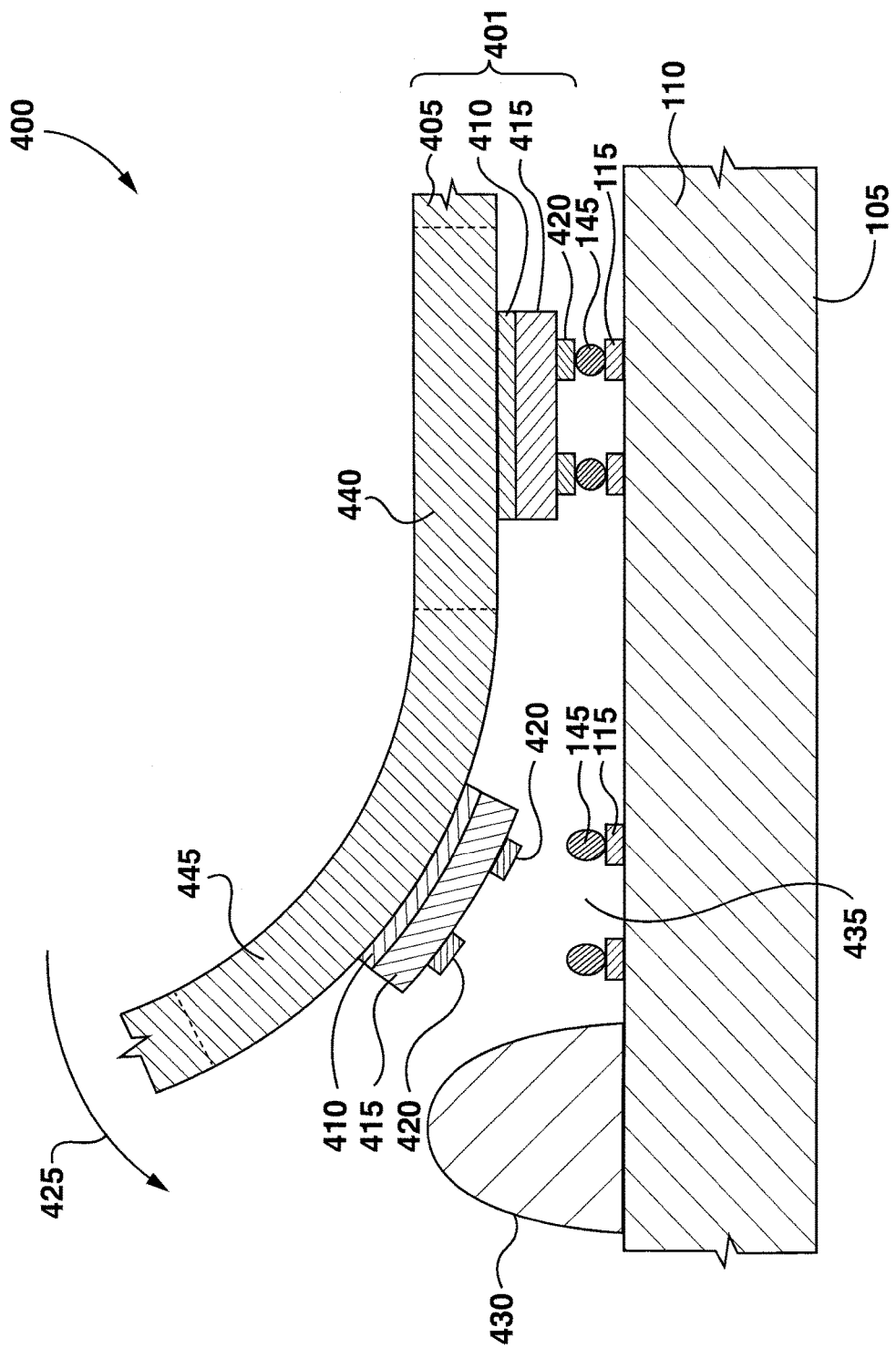
FIG. 4 shows a cross-section of yet another implementation of the active matrix OLED display in the process of being assembled, according to non-limiting implementations.

FIG. 4 shows a cross-section of an active matrix OLED display 400 in the process of being assembled. Active matrix OLED display 400 comprises backplane 105 in the process of being joined using conductive links 145 to an OLED assembly 401. OLED assembly 401 comprises an OLED substrate 405, on which first electrodes 410 are formed for each pixel region 440,445. Light emitting materials 415 are then deposited on first electrodes 410, and one or more pixel contacts 420 are formed on light emitting materials 415 per pixel region 440,445. Conductive links 145 are configured to electrically connect each pixel contact 420 to a corresponding controllable gated electronic component 115 secured at a predetermined position to backplane substrate 110.

OLED substrate 405 is flexible, allowing for OLED assembly 401 to be unrolled along direction 425 against backplane 105. First electrode 410, light emitting materials 415, and pixel contacts 420 can be sufficiently flexible so that they can flex with OLED substrate 405 without compromising the mechanical and electrical integrity of OLED assembly 401, for example through delamination, flaking, and cracking. In some implementations, OLED substrate 405 can comprise a sheet having a thickness of less than about 0.5 mm. In other implementations, OLED substrate 405 can comprise a sheet having a thickness of equal to or less than about 0.1 mm. In yet other implementations, OLED substrate 405 can comprise a sheet having a thickness of equal to or less than about 0.025 mm. OLED substrate 405 can comprise materials including but not limited to glass and a plastic material. For example, AF 32™ eco and D 263™ eco ultra-thin glass sheets made by Schott, Inc. can be used.

FIG. 4 shows pixel region 440 already joined to backplane 105, while pixel region 445 is in the process of being unrolled against and being joined to backplane 105. Before OLED assembly 401 is unrolled against backplane 105, globules of conductive link 145 can be deposited on controllable gated electronic components 115 in order to electrically connect those electronic components to corresponding pixel contacts 420 of OLED assembly 401. In some implementations, conductive links 145 can be deposited as a wet conductive epoxy which then dries and/or cures after OLED assembly 401 has been unrolled against backplane 105. The conductive epoxy can comprise particles of carbon or a metal such as silver.

In other implementations, conductive links 145 can comprise a low temperature solder which is deposited on controllable gated electronic components 115 and remains solid as OLED assembly 401 is unrolled against backplane 105. Then backplane 105 and OLED assembly 401 can be heated to a temperature sufficient to soften the low temperature solder and electrically connect controllable gated electronic components 115 to pixel contacts 420.

In other words, in some implementations backplane 105 is joined to OLED assembly 401 as one is being unrolled against the other, while in other implementations, the unrolling takes place before backplane 105 is joined to OLED assembly 401. The joining can comprise electrically connecting backplane 105 to OLED assembly 401 such that controllable gated electronic components 115 can power and/or control corresponding pixel regions 440,445. It is also contemplated that conductive links 145 can comprise other materials which can be softened and/or cured using electromagnetic radiation.

While the above description discusses conductive links 145 being deposited on controllable gated electronic components 115 of backplane 105, it is also contemplated that before backplane 105 and OLED assembly 401 are joined, conductive links can be deposited on pixel contacts 420 or on both controllable gated electronic components 115 and on pixel contacts 420.

In some implementations, underfill 430 can be introduced into gaps 435 by depositing underfill 430 on backplane substrate 110 in a flowable state and then using wicking and/or the capillary forces between backplane 105 and OLED assembly 401 that is being unrolled against backplane 105 to drive underfill 430 into gaps 435. While underfill 430 is shown in FIG. 4 as being deposited on backplane substrate 110, it is also contemplated that underfill 430 can be deposited on OLED substrate 405 or on both backplane substrate 110 and OLED substrate 405.

In order to prevent the spreading underfill 430 from contaminating the electrical contacts such as pixel contacts 420, the electrical contacts can be modified to have preferential wettability for conductive link 145 over underfill 430. Alternatively and/or in addition, conductive links 145 can be selected to have a viscosity higher than the viscosity of underfill 430 which will also reduce the possibility of underfill 430 interfering with the conductive links 145 forming an electrical connection between controllable gated electronic components 115 and corresponding pixel contacts 420.

Conductive links 145 and/or underfill 430 can be deposited on one or more of backplane 105 and OLED assembly 401 using any suitable technique including but not limited to inkjet printing, screen printing, and depositing using a robotic arm. While FIG. 4 and the foregoing description discusses OLED substrate 405 being flexible, it is also contemplated that backplane substrate 110 can be flexible or that both backplane substrate 110 and OLED substrate 405 can be flexible. Use of flexible backplane substrate 110 and/or OLED substrate 405 can make it easier to store and/or transport large area backplane and OLED substrates, and can facilitate and reduce the fabrication space required for joining backplane 105 to OLED assembly 401 to assemble active matrix OLED display 400.

Referring back to FIG. 1, it can be seen that light generated by light emitting material 135 of each pixel region 150,155 must pass through OLED substrate 125 in order to be emitted out of active matrix OLED display 100 in direction of light emission 160 and reach a viewer. As the light emitted by each pixel region 150,155 enters OLED substrate 125, OLED substrate 125 can act as an optical waveguide and conduct at least some of the light generated by one pixel region into adjacent pixel regions. For example, some of the light generated at pixel region 150 can be conducted by OLED substrate 125 into adjacent pixel region 155. This conducted light can represent optical cross-talk between adjacent pixels. In addition to OLED substrate 125, other transparent layers of OLED assembly 120 that span multiple pixel regions 150,155 can also act as such a waveguide; an ITO shared first electrode 130 spanning multiple pixel regions 150,155 (not shown in FIG. 1) can be an example of such a transparent layer.

Figure 5:
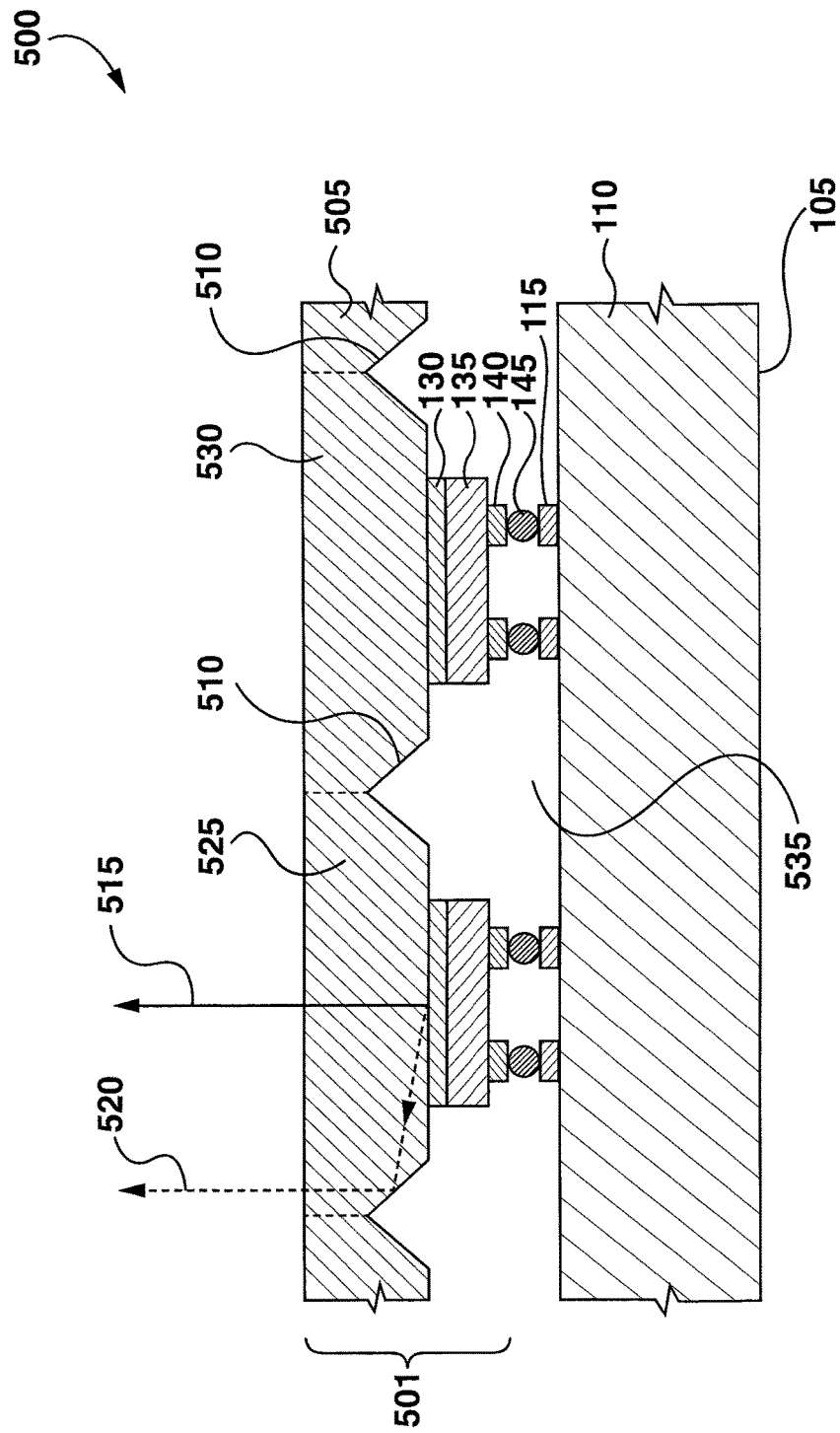
FIG. 5 shows a cross-section of yet another implementation of the active matrix OLED display, according to non-limiting implementations.

FIG. 5 shows a cross-section of active matrix OLED display 500 with an at least partially reduced inter-pixel region optical cross-talk described above. Active matrix OLED display 500 comprises backplane 105 electrically connected to an OLED assembly 501. Backplane 105 comprises a plurality of controllable gated electronic components 115 secured to backplane substrate 110 at predetermined positions.

OLED assembly 501 comprises an OLED substrate 505 having one or more pixel regions 525,530. For each pixel region 525,530, a first electrode 130 is formed on OLED substrate 505, and then light emitting materials 135 are deposited on first electrode 130. For each pixel region 525,530, one or more pixel contacts 140 are formed on light emitting material 135. Backplane 105 is joined to OLED assembly 501 using conductive links 145 between each pixel contact 140 and a corresponding controllable gated electronic component 115.

OLED assembly 501 also comprises grooves 510 between each pixel region 525,530 and its adjacent pixel region. Grooves 510 are an example of an optical barrier between adjacent pixel regions such as pixel regions 525,530. Such optical barriers can at least partially optically isolate each pixel region from its adjacent pixel regions. Grooves 510 can extend partway through the thickness of OLED substrate 505, and at least partially block propagation of light emitted at one pixel region into adjacent pixel regions through portions of OLED assembly 501 such as OLED substrate 505. On the other hand, portions of emitted light that propagate out of the pixel region 525 along for example in the direction of light emission 515 can be unaffected by grooves 510.

Grooves 510 can be at least partially light scattering and/or light absorbing, for example due to having frosted or roughened surfaces. In some implementations, grooves 510 can be partially or totally internally reflecting and/or can have their surfaces coated with a reflective material such as a metal, i.e. can be metalized. When light propagating towards an adjacent pixel region impinges on groove 510 it can be reflected away from adjacent pixel regions as shown for example by light ray 520.

In addition, while not shown in FIG. 5, grooves 510 can be at last partially filled with light absorbing and/or light scattering materials to at least partially absorb and/or scatter the light propagating from a given pixel region towards adjacent pixel regions through components of OLED assembly 501 such as OLED substrate 505. In some implementations, gaps 535 between backplane 105 and OLED assembly 501 can be filled with an underfill material. This underfill can strengthen the mechanical connection between backplane 105 and OLED assembly 501. In addition, the underfill can fill at least a portion of grooves 510, and can be selected to be at least partially absorbing or scattering of the light emitted at pixel regions 525, 530. The underfill can also be selected to be substantially black as described above.

While FIG. 5 shows v-shaped grooves, it is contemplated that grooves 510 can have any suitable shape including but not limited to rectangular trenches. Grooves 510 can be made by any suitable technique including but not limited to wet chemical etching, laser etching, scribing, sawing using a dicing saw, and deep reactive ion etching (DRIE) and in particular the Bosch process for DRIE.

Figure 6:
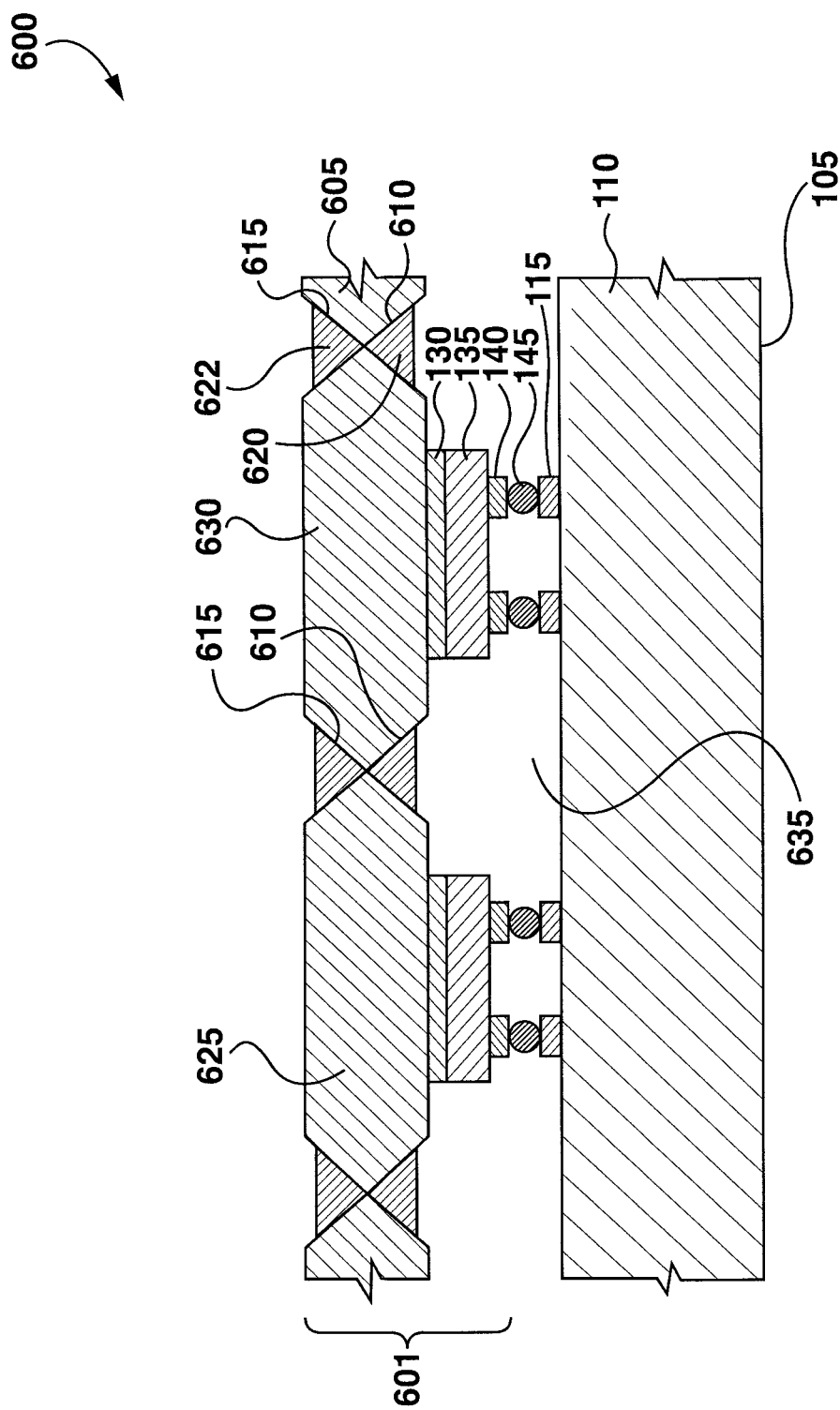
FIG. 6 shows a cross-section of yet another implementation of the active matrix OLED display, according to non-limiting implementations.

While grooves 510 can provide only partial blocking of the light propagating from one pixel region into adjacent pixel regions through components of OLED assembly 501, using complementary sets of grooves can increase the portion of such light that can be blocked. FIG. 6 shows a cross-section of an active matrix OLED display 600 with such complementary grooves. Active matrix OLED display 600 comprises backplane 105 joined to an OLED assembly 601 using conductive links 145. Backplane 105 comprises controllable gated electronic components 115 secured to backplane substrate 110 at predetermined positions.

OLED assembly 601 comprises OLED substrate 605 and a first electrode 130 formed on OLED substrate 605 for each pixel region 625,630. Light emitting materials 135 are deposited on first electrode 130, and pixel contacts 140 are formed on light emitting materials 135 per pixel region 625,630. Conductive links 145 electrically connect each pixel contact 140 to corresponding controllable gated electronic components 115.

A first set of grooves 610 are formed in a first surface of OLED substrate 605, and can be generally similar to grooves 510 described in relation to FIG. 5. A second set of grooves 615 are formed in second surface of OLED substrate 605 opposite the first surface. Grooves 615 can be complementary to grooves 610 in the sense that each groove 615 can complement the light blocking of a corresponding groove 610. In some implementations, grooves 610 can be about aligned with grooves 615. While FIG. 6 shows grooves 610 and grooves 615 meeting at a common point, it is also contemplated that grooves 610 and grooves 615 may not meet. It is also contemplated that grooves 610 and 615 may be offset from each. When grooves 610 and 615 are offset, each groove can extend more than halfway through the thickness of OLED substrate 605.

In addition, while FIG. 6 shows grooves 610 and grooves 615 as both being v-shaped, it is contemplated that in other implementations grooves 615 can have a shape different than grooves 610. In order to preserve the mechanical integrity of OLED substrate 605, the set of grooves that is formed first can be backfilled before forming the second set of grooves. For example, if grooves 610 are formed first, grooves 610 can be backfilled with backfill material 620 before grooves 615 are formed. Backfill material 620 can be one or more of light scattering, light absorbing, and/or light reflecting. In some implementations, the first set of grooves 610 can be backfilled with light scattering and/or light absorbing glass and then OLED substrate 605 can be fired in an oven to improve mechanical strength of OLED substrate 605.

The backfill material can comprise a fireable glass paste comprising glass powder mixed with an organic binder that evaporates and/or oxidizes into a gas during the firing before the glass powder melts. Such a glass paste can be colored; for example, it can be black. One example of such a glass paste is Glassline™ Paint made by Glassline Products. In some implementations, the backfill material can be doctor-bladed into the grooves and then, if necessary, the surface of the OLED substrate can be re-polished.

In some implementations, gaps 635 between backplane 105 and OLED assembly 601 can be at least partially filled with an underfill. In yet other implementations, underfill material filling gaps 635 can also at least partially fill grooves 610. Grooves 615 can also be backfilled with a backfill material 622. Backfill material 622 can be the same as or different from backfill material 620. While FIG. 6 shows grooves 610 and grooves 615 as being filled partially with backfill materials 620 and 622 respectively, it is also contemplated that one or more of grooves 610 and grooves 615 can be filled completely with backfill materials 620 and 622 respectively. In some implementations, one or more of grooves 610 and grooves 615 can be overfilled with backfill materials 620 and 622 respectively, and then the corresponding surface of OLED substrate 605 can be polished flat.

In some implementations, grooves 610 are formed first and backfilled with backfill material 620, before grooves 615 are formed. Once both sets of grooves are formed, then first electrode 130, light emitting materials 135, and pixel contacts 140 can be formed in order to form OLED assembly 601. In other implementations, grooves 610 are formed and can be backfilled or left unfilled. Then first electrode 130, light emitting materials 135, and pixel contacts 140 can be formed in order to form OLED assembly 601, followed by joining OLED assembly 601 to backplane 105. Then grooves 615 are formed and can be backfilled or left unfilled.

In some implementations, first set of grooves 610 is formed and then backfilled with a backfill material configured to at least partially restore the mechanical strength of OLED substrate 605. Then the second set of grooves 615 can be formed and can extend part way through OLED substrate 605 and also part way into grooves 610. For example, the backfill material can comprise black and/or opaque glass. Grooves 610 can be filled with such a backfill material and then OLED substrate 605 and the backfill material can be cured and/or fired in an oven to at least partially restore the mechanical strength of OLED substrate 605. Then the second set of grooves 615 can be formed and can extend part way through OLED substrate 605 and also part way into the fired and/or cured backfill material filling grooves 610. When grooves 615 extend into and overlap with grooves 610 in such a manner, the combination of grooves 610 and 615 can act as an optical barrier extending across the full thickness of OLED substrate 605.

In the implementations where grooves are formed in the OLED substrate to separate pixel regions, it can become impractical to use a first electrode, i.e. a counter or ground electrode, that spans multiple pixel regions. In response, in some implementations the ground or counter first electrode can be made per-pixel where each pixel region has a dedicated ground or counter first electrode.

FIGS. 7a, 7b, 7c, 7d, and 7e, hereinafter referred to collectively as FIGS. 7a-e show in cross-section a selection of steps for fabricating an active matrix OLED display 700 having grooves 715 that optically separate each pixel region of active matrix OLED display 700 from its adjacent pixels.

Figure 7A:
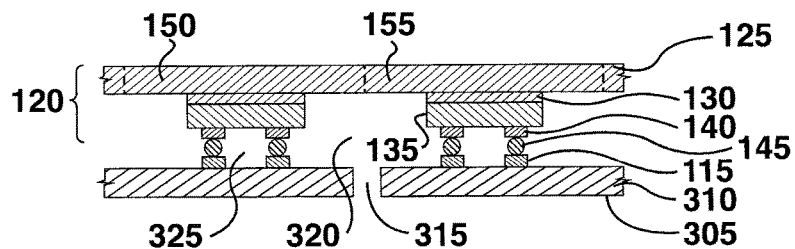
FIGS. 7a, 7b, 7c, 7d, and 7e show in cross-section a selection of steps for fabricating yet another implementation of the active matrix OLED display, according to non-limiting implementations.

FIG. 7a shows OLED assembly 120 joined to backplane 305. It is contemplated that backplane 105 or other suitable backplanes can also be used. OLED assembly 120 comprises OLED substrate 125 with first electrodes 130 formed on OLED substrate 125 for each pixel region 150,155. Light emitting materials 135 are formed on first electrode 130 and pixel contacts 140 are formed on light emitting materials 135. Backplane 305 comprises a plurality of controllable gated electronic components 115 secured to backplane substrate 310 at predetermined positions. Backplane substrate 310 also comprises a plurality of through holes 315 for injecting underfill into gaps 320,325 between OLED assembly 120 and backplane 305. Conductive links 145 are used to electrically connect pixel contacts 140 to corresponding controllable gated electronic components 115.

Figure 7B:
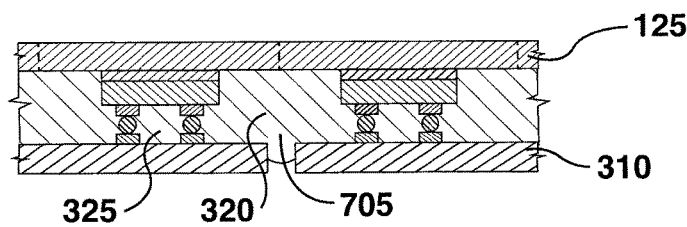
Figure 7C:
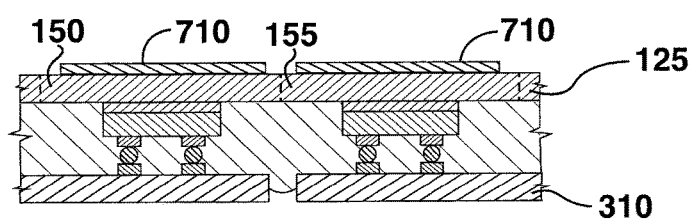
Figure 7D:
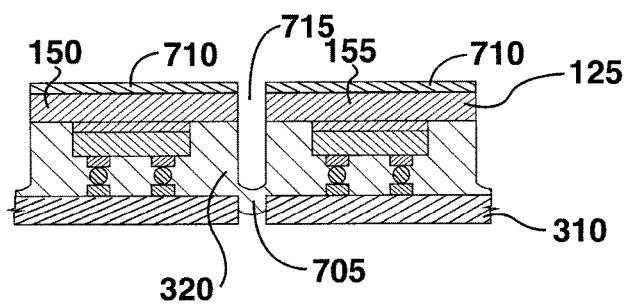

FIG. 7b shows underfill 705 injected via through hole 315 to substantially fill gaps 320,325. FIG. 7c shows masks 710 formed on a portion of each pixel region 150,155. Masks 710 can comprise materials including but not limited to amorphous silicon and chrome. FIG. 7d shows groove 715 formed in the region between adjacent pixel regions 150 and 155 which is not protected by masks 710. Groove 715 can extend through a full thickness of OLED substrate 125, and can extend further into underfill 705 filing gap 320. Groove 715 can be formed by suitable processes including but not limited to chemical etching and deep reactive ion etching. Underfill 705 can protect the potentially sensitive light emitting materials 135, pixel contacts 140, conductive links 145, and controllable gated electronic components 115 from the reactive etching agents.

Figure 7E:
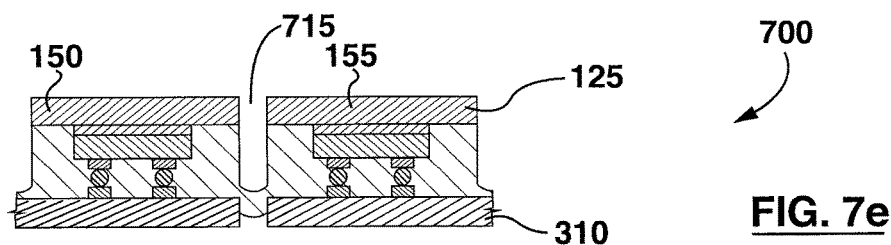

FIG. 7e shows removal of masks 710 to yield active matrix OLED display 700. Masks 710 can be removed by any suitable method including but not limited to selective etching and the like. While only one groove 715 is numbered in FIGS. 7d and 7e, multiple similar grooves are formed separating other pixel regions from their adjacent pixel regions. These grooves optically insulate one pixel region from its adjacent pixel regions by preventing light from propagating from one pixel region into its adjacent pixel regions through components of OLED assembly 120 such as OLED substrate 125. In some implementations, the grooves including groove 715 can be backfilled to increase the mechanical strength of active matrix OLED display 700. In addition, the backfill material can be optically scattering, absorbing, and/or reflecting in order to further optically insulate each pixel region from its adjacent pixel regions.

FIGS. 8a, 8b, 8c, 8d, and 8e, hereinafter referred to collectively as FIGS. 8a-e, show in cross-section a selection of steps for fabricating an active matrix OLED display 800 where each pixel region is optically separated from its adjacent pixel regions.

Figure 8A:
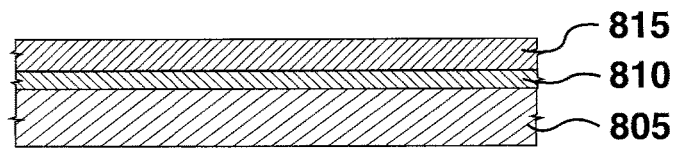
FIGS. 8a, 8b, 8c, 8d, and 8e show in cross-section a selection of steps for fabricating yet another implementation of the active matrix OLED display, according to non-limiting implementations.
Figure 8B:
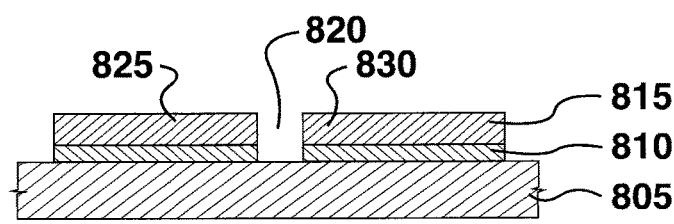

FIG. 8a shows an initial step in forming an OLED assembly, where an OLED substrate 815 is secured using an adhesive 810 to a support 805. Support 805 refers to a component that need no be the same as, and can be different from, the "support material" discussed above in relation to the backplane substrate. Support 805 can comprise any suitable material including but not limited to glass and plastics. FIG. 8b shows formation of groove 820 in OLED substrate 815 to separate it into regions 825 and 830. Regions 825 and 830 will be used to form pixel regions of the OLED assembly. While only one groove 820 is numbered in FIG. 8b, multiple similar grooves are formed to separate OLED substrate 815 into a plurality of regions that will be used to form pixel regions.

Grooves including groove 820 can be formed by any suitable method including but not limited to wet chemical etching, laser etching, scribing, and sawing using a dicing saw. Optionally the grooves can extend into adhesive 810, and while not shown in FIGS. 8b-e, can extend even part way into support 805.

Figure 8C:
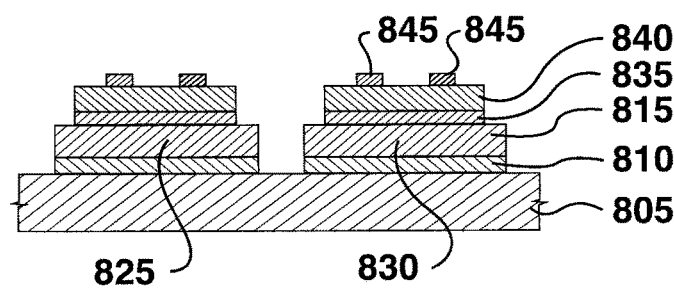

FIG. 8c shows first electrodes 835 formed on each region 825,830, followed by deposition of light emitting materials 840 on first electrodes 835. Then pixel contacts 845 are formed on light emitting materials 840. First electrode 835, light emitting materials 840, and pixel contacts 845 can be similar to first electrode 130, light emitting materials 135, and pixel contacts 140 respectively. After formation of first electrodes 835, light emitting materials 840, and pixel contacts 845 regions 825,830 of OLED substrate 815 are referred to as pixel regions. At this point, pixel regions 825,830 remain attached to and supported by support 805.

Figure 8D:
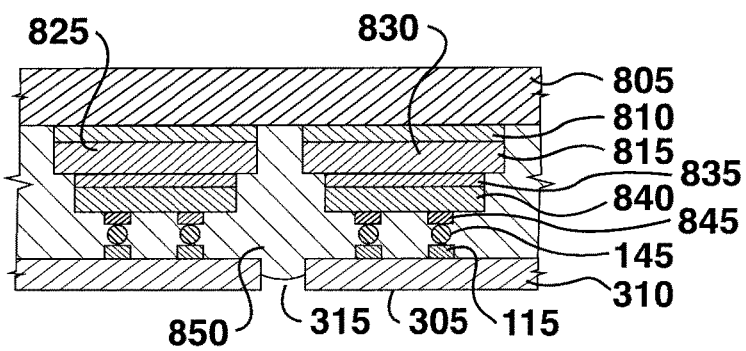

FIG. 8d shows pixel regions 825,830 joined to backplane 305. It is contemplated that backplane 105 or other suitable backplanes can also be used. Conductive links 145 electrically connect each pixel contact 845 to a corresponding controllable gated electronic component 115 on backplane substrate 310 of backplane 305. Optionally, underfill 850 can be injected into spaces between support 805 and backplane 305 via through holes 315 in backplane substrate 310.

Figure 8E:
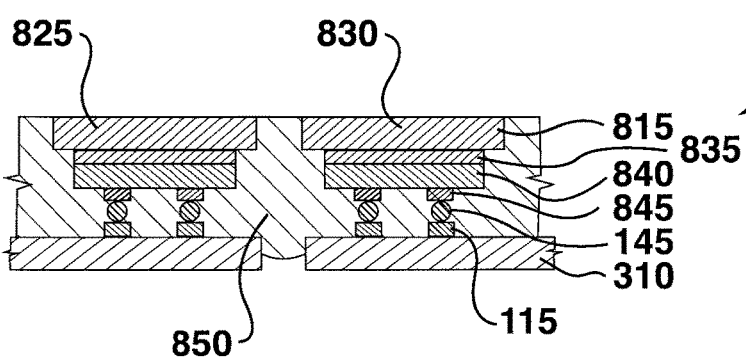

Once pixel regions 825,830 are connected to backplane 305, then support 805 can be removed. FIG. 8e shows active matrix OLED display 800 after removal of support 805. Support 805 can be removed by selectively removing adhesive 810. In some implementations, a UV laser can be used to selectively ablate adhesive 810 without damaging any components of pixel regions 825,830. In other implementations, adhesive 810 can comprise a low temperature wax, and can be softened by heating active matrix OLED display 800 to a temperature sufficient to soften the wax but low enough to leave unharmed the components of active matrix OLED display 800. In yet other implementations, both support 805 and adhesive 810 can be selectively etched away while leaving components of active matrix OLED display 800 intact.

The separation of the OLED substrate 815 into separate pieces forming each pixel region 825,830 prevents light from propagating from one pixel region through OLED substrate 815 into adjacent pixel regions. In addition, underfill 850 can be selected to further optically insulate each pixel from its adjacent pixels. For example, underfill 850 can comprise one or more of an optically absorbing material, an optically scattering material, an optically reflective material, and/or a substantially black material.

In some implementations, not depicted in the Figures, fabrication of the active matrix OLED display can follow steps similar to those depicted in FIGS. 8a-e, with the main difference being that a support such as support 805 is not used. The OLED substrate can be cut into portions that are used for forming pixel regions. Then the spaces between these portions can be filled with a glass backfill, and the portions of the OLED substrate and the glass backfill can be fired in an oven to restore the mechanical strength of the OLED substrate. The glass backfill can comprise an opaque and/or a substantially black material.

While the foregoing discussion describes one OLED assembly joined to a backplane, it is also contemplated that multiple OLED assemblies can be joined to the backplane one adjacent to another, i.e. can be "tiled" together, to form a tiled active matrix OLED display. Such tiled implementations can comprise optical barriers between adjacent OLED assemblies in addition to and/or instead of optical barriers between pixel regions of a given OLED assembly. Such inter-OLED assembly optical barriers can comprise, but are not limited to, light absorbing materials and light scattering materials. For example, the inter-OLED assembly optical barriers can comprise one or more of black and/or opaque glass and epoxy. In some implementations the inter-OLED assembly optical barriers are configured to be detached or detachable from the OLED assemblies to allow for removal and/or replacement of individual OLED assemblies within the tiled active matrix OLED display.

In some implementations the dimensions and/or the optical properties of the inter-OLED assembly optical barriers can be selected to be similar to the dimensions and/or optical properties of the inter-pixel region optical barriers. In addition, in some implementations, the optical properties of the inter-pixel region optical barriers can be selected to be similar to the optical properties at or near the outer edges of each OLED assembly. These techniques can allow seams between OLED assemblies, which seams can include the inter-OLED assembly optical barriers, to appear optically similar to the areas between adjacent pixel regions of a given OLED assembly, which areas can include inter-pixel region optical barriers. This optical similarity, in turn, can make the tiled active matrix OLED display appear seamless under some viewing conditions.

While the foregoing describes one or multiple OLED assemblies joined to a single backplane, it is also contemplated that the area of the OLED assembly and the area of the backplane can be independent of one another. In other words, it is contemplated that a large OLED assembly can be joined to multiple smaller backplanes. In addition, it is also contemplated that a number of smaller active matrix OLED displays, each of which can comprise one or more OLED assemblies joined to one or more backplanes, can themselves be used as tiles and assembled one adjacent to another to form a tiled display comprising multiple active matrix OLED displays. For example, a tiled active matrix OLED display can be formed by joining six 2×2 inch OLED assemblies to one 4×6 inch backplane to form a 4×6 inch tiled display. Then four of these 4×6 inch tiled displays can themselves be assembled one adjacent to another to form one 8×12 inch tiled OLED display. In the case where active matrix OLED displays are used as tiles and assembled together, it is also contemplated that there can be optical barriers in the seams between the adjacent OLED displays.

In addition, while the forgoing discussion describes displays, it is also contemplated that similar methods and structures can be used to fabricate detectors for detecting light and in response producing an electrical signal. For example, the OLED assembly can be replaced with a light detecting assembly comprising light detecting materials instead of the light emitting materials of the OLED assembly. When light is detected, the light detecting assembly can generate an electrical signal which is then sampled by the controllable gated electronic components. Examples of such a detector include but are not limited to an infra-red light detector and an X-ray light detector.

The above-described implementations are intended to be examples only and alterations and modifications may be effected thereto, by those of skill in the art, without departing from the scope of the invention which is defined solely by the claims appended hereto.

I claim:

1. A method of forming an active matrix OLED display, the method comprising:
   providing a backplane comprising:
     a backplane substrate comprising a support material and one or more component substrates formed separately from the support material, then secured to the support material each at a predetermined position on the support material, and then planarized to expose a cross-sectional surface of the one or more component substrates;
     a plurality of controllable gated electronic components formed on or directly beneath the surface of the corresponding component substrates, the controllable gated electronic components configured to control one or more pixels of the active matrix OLED display; and
   providing an OLED assembly comprising one or more pixel regions each having one or more pixel contacts, the OLED assembly formed separately from the backplane on an OLED substrate different from the backplane substrate; and
   joining the OLED assembly to the backplane, the joining comprising electrically connecting one or more of the pixel contacts to the corresponding controllable gated electronic components.

2. The method of claim 1, wherein each pixel region comprises a light emissive area and at least one of the pixel contacts corresponding to each pixel region is contained within the corresponding light emissive area.

3. The method of claim 1, wherein the electrically connecting comprises using a flexible conductive link to connect the one or more of the pixel contacts to the corresponding controllable gated electronic components.

4. The method of claim 3, wherein the flexible conductive link comprises one or more of a conductive epoxy, a solder, and a low temperature solder.

5. The method of claim 1, further comprising underfilling with a substantially black underfill at least a portion of gaps between the OLED assembly and the backplane joined together.

6. The method of claim 1, wherein the backplane substrate comprises a plurality of through holes configured for allowing injecting an underfill through the through holes into at least a portion of gaps between the OLED assembly and the backplane joined together.

7. The method of claim 1, wherein one or both of the backplane and the OLED assembly is flexible and configured to be unrolled one against the other one or more of before and during the backplane being joined to the OLED assembly.

8. The method of claim 7, further comprising depositing an underfill on at least a portion of one or both of the backplane and the OLED assembly before one is unrolled against the other in order to fill with the underfill at least a portion of gaps between the OLED assembly and the backplane joined together.

9. The method of claim 1, wherein the OLED assembly further comprises an optical barrier between each pixel region and its adjacent pixel regions, the optical barrier configured to at least partially block a light emitted at each pixel region from entering adjacent pixel regions through the OLED assembly.

10. The method of claim 9, wherein the optical barrier comprises grooves in a first surface of the OLED substrate, the grooves configured to at least partially block the light emitted at each pixel region from entering the adjacent pixel regions through the OLED assembly.

11. The method of claim 10, wherein the optical barrier further comprises further grooves in a second surface of the OLED substrate, the second surface opposite the first surface, the further grooves aligned with the grooves.

12. The method of claim 10, wherein the grooves extend through a full thickness of the OLED substrate thereby separating a portion of the OLED substrate corresponding to each pixel region from portions of the OLED substrate corresponding to adjacent pixel regions.

13. The method of claim 12, wherein the OLED assembly is joined to the backplane and then at least a portion of gaps between the OLED assembly and the backplane is filled by an underfill before the grooves are formed.

14. The method of claim 12, wherein the OLED substrate is secured to a support and then the grooves are formed before depositing one or more light emitting layers on the OLED substrate to form the OLED assembly and the joining the OLED assembly to the backplane.

15. The method of claim 14, wherein the support is removed from the OLED substrate after the joining the OLED assembly to the backplane.

16. The method of claim 15, wherein the OLED substrate is secured to the support using an adhesive and the removing comprises using a UV laser to ablate the adhesive.

17. The method of claim 10, wherein the grooves are formed by one or more of: wet chemical etching, laser etching, scribing, sawing using a dicing saw, and deep reactive ion etching.

18. The method of claim 10, wherein the grooves are configured to be one or more of:
   totally internally reflecting and metalized, in order to at least partially reflect the light emitted at that pixel region away from the adjacent pixel regions.

19. The method of claim 10, wherein the grooves are configured to be one or more of:
   light scattering and light absorbing, in order respectively to at least partially scatter and partially absorb the light emitted at each pixel region and propagating towards adjacent pixel regions through the OLED assembly.

20. The method of claim 10, wherein the grooves are at least partially filled with one or more of:
   a light scattering material and a light absorbing material, in order respectively to at least partially scatter and partially absorb the light emitted at each pixel region and propagating towards adjacent pixel regions through the OLED assembly.

21. A method of forming an active matrix OLED display, the method comprising:
   providing a backplane comprising:
      a backplane substrate;
      a plurality of controllable gated electronic components each at a predetermined position on or directly beneath a surface of the backplane substrate, the controllable gated electronic components configured to control one or more pixels of the active matrix OLED display; and
   providing an OLED assembly comprising one or more pixel regions each having one or more pixel contacts, the OLED assembly formed separately from the backplane on an OLED substrate different from the backplane substrate, the OLED assembly further comprising an optical barrier between each pixel region and its adjacent pixel regions, the optical barrier comprising one or more grooves in a first surface of the OLED substrate, the optical barrier configured to at least partially block a light emitted at each pixel region from entering adjacent pixel regions through the OLED assembly; and
   joining the OLED assembly to the backplane, the joining comprising using conductive links to electrically connect one or more of the pixel contacts to the corresponding controllable gated electronic components.

* * * * *